United States Patent
Ahn

(10) Patent No.: US 7,906,399 B2
(45) Date of Patent: Mar. 15, 2011

(54) NARROW WIDTH METAL OXIDE SEMICONDUCTOR TRANSISTOR

(75) Inventor: Jung Ho Ahn, Chungbuk (KR)

(73) Assignee: Dongbu Electronics Co., Ltd., Seoul (KR)

( * ) Notice: Subject to any disclaimer, the term of this patent is extended or adjusted under 35 U.S.C. 154(b) by 30 days.

(21) Appl. No.: 12/416,042

(22) Filed: Mar. 31, 2009

(65) Prior Publication Data

US 2009/0186461 A1 Jul. 23, 2009

Related U.S. Application Data

(62) Division of application No. 11/646,727, filed on Dec. 27, 2006, now Pat. No. 7,528,455.

(30) Foreign Application Priority Data

Dec. 29, 2005 (KR) .................. 10-2005-0134163

(51) Int. Cl.
*H01L 21/336* (2006.01)
(52) U.S. Cl. .................. 438/301; 438/197; 438/286
(58) Field of Classification Search .................. 438/197, 438/299, 301, 286; 257/344, 401, 408
See application file for complete search history.

(56) References Cited

U.S. PATENT DOCUMENTS

| | | | | |
|---|---|---|---|---|
| 4,224,633 A | * | 9/1980 | Mogi et al. | 257/387 |
| 4,830,971 A | * | 5/1989 | Shibata | 438/143 |
| 5,144,394 A | * | 9/1992 | Hirao et al. | 257/396 |
| 5,270,565 A | * | 12/1993 | Lee et al. | 257/358 |
| 5,451,799 A | * | 9/1995 | Kurimoto et al. | 257/174 |
| 5,821,600 A | | 10/1998 | Chan | |
| 5,913,123 A | * | 6/1999 | Lin et al. | 438/299 |
| 6,476,424 B1 | | 11/2002 | Ishida | |
| 6,611,027 B2 | * | 8/2003 | Ichikawa | 257/355 |
| 6,692,996 B2 | | 2/2004 | Lee et al. | |
| 6,787,823 B2 | | 9/2004 | Shibutani | |
| 6,933,578 B2 | | 8/2005 | Sato | |
| 7,064,453 B2 | | 6/2006 | Sato | |
| 7,093,215 B2 | | 8/2006 | Sahara et al. | |
| 7,105,901 B1 | | 9/2006 | Miyanishi et al. | |
| 2002/0093028 A1 | | 7/2002 | Konishi et al. | |
| 2003/0042529 A1 | | 3/2003 | Hashimoto et al. | |
| 2004/0238897 A1 | | 12/2004 | Oishi | |
| 2005/0093019 A1 | | 5/2005 | Kato | |
| 2005/0167728 A1 | * | 8/2005 | Kothandaraman et al. | 257/314 |
| 2006/0006474 A1 | | 1/2006 | Tsuboi | |

* cited by examiner

*Primary Examiner* — Kevin M Picardat
(74) *Attorney, Agent, or Firm* — The Law Offices of Andrew D. Fortney; Andrew D. Fortney

(57) ABSTRACT

Disclosed is a semiconductor transistor for enhancing performance of PMOS and NMOS transistors, particularly current driving performance, while reducing a narrow width effect. A narrow width MOS transistor includes: a channel of which width is W0 and length is L0; an active area including source and drain areas formed at both sides with the channel as a center; a gate insulating layer formed on the channel; a gate conductor formed on the gate insulating layer and intersecting the active area; a first additional active area of width is larger than that W0 of the channel as an active area added to the source area; and a second additional active area of width is larger than that W0 of the channel as an active area added to the drain area. When the structure of the transistor having the additional active areas is applied to NMOS and PMOS transistors, a driving current is represented as 107.27% and 103.31%, respectively. Accordingly, the driving currents of both PMOS and NMOS transistors are enhanced.

18 Claims, 3 Drawing Sheets

NARROW WIDTH METAL OXIDE SEMICONDUCTOR TRANSISTOR

The present application is a divisional application of U.S. application Ser. No. 11/646,727, filed Dec. 27, 2006, now U.S. Pat. No. 7,528,455, which is incorporated herein by reference in its entirety.

BACKGROUND OF THE INVENTION

1. Field of the Invention

The present invention relates to a semiconductor transistor, and more particularly to a semiconductor transistor for enhancing the performance of PMOS and NMOS transistors, particularly the driving current performance, while reducing the narrow width effect.

2. Description of the Related Art

As the size of transistors is scaled down, the narrow width and reverse narrow width effects have emerged as serious problems, together with the short channel effect. Since a portion of a gate electrode generally overlaps with an isolation area, the narrow width effect is influenced by parasitic charges due to the bird's beak of an isolation layer or field stop impurities. Therefore, more charges are supplied than when a gate forms a channel of a transistor, and thus there is an advantage in that the threshold voltage of the transistor increases as a channel width becomes narrow.

In general, as the channel width of a transistor becomes narrow, a threshold voltage increases due to the narrow width effect. However, a threshold voltage may decrease depending on the manufacturing process. For example, if a field oxide layer is formed and an ion implantation is then performed with respect to the field oxide layer, impurities in a field area are distributed to have a lower density than in a channel area of a transistor. For this reason, there appears a phenomenon in which a threshold voltage increases as a channel width becomes narrow.

Further, if an isolation area is formed with LOCOS (Local Oxidation of Silicon) in a process of manufacturing a transistor with a narrow channel width, a threshold voltage generally increases. However, if an isolation area is formed through an STI (Shallow Trench Isolation), the threshold voltage decreases, and thus a current increases.

Meanwhile, if the channel lengths and widths of PMOS and NMOS transistors are adjusted to enhance their performance, the performance of one transistor is enhanced but the performance of the other transistor is deteriorated. Thus, it is important to simultaneously enhance the performance of PMOS and NMOS transistors when enhancing the performance of transistors, such as current driving performance.

SUMMARY OF THE INVENTION

An object of the present invention is to provide a semiconductor transistor for enhancing the performance of PMOS and NMOS transistors while reducing the narrow width effect.

Another object of the present invention is to provide a semiconductor transistor for enhancing the current driving performance of a MOS transistor with a narrow channel width.

According to one aspect of the present invention, there is provided a MOS transistor made of a metal oxide semiconductor, which includes: a channel of which width is W0 and length is L0; an active area including source and drain areas formed at both sides with the channel as a center; a gate insulating layer formed on the channel; a gate conductor formed on the gate insulating layer and intersecting the active area; a first additional active area of width is larger than that W0 of the channel as an active area added to the source area; and a second additional active area of width is larger than that W0 of the channel as an active area added to the drain area.

DETAILED DESCRIPTION OF THE INVENTION

Hereinafter, preferred embodiments of the present invention will be described with reference to the accompanying drawings.

Figure 1:
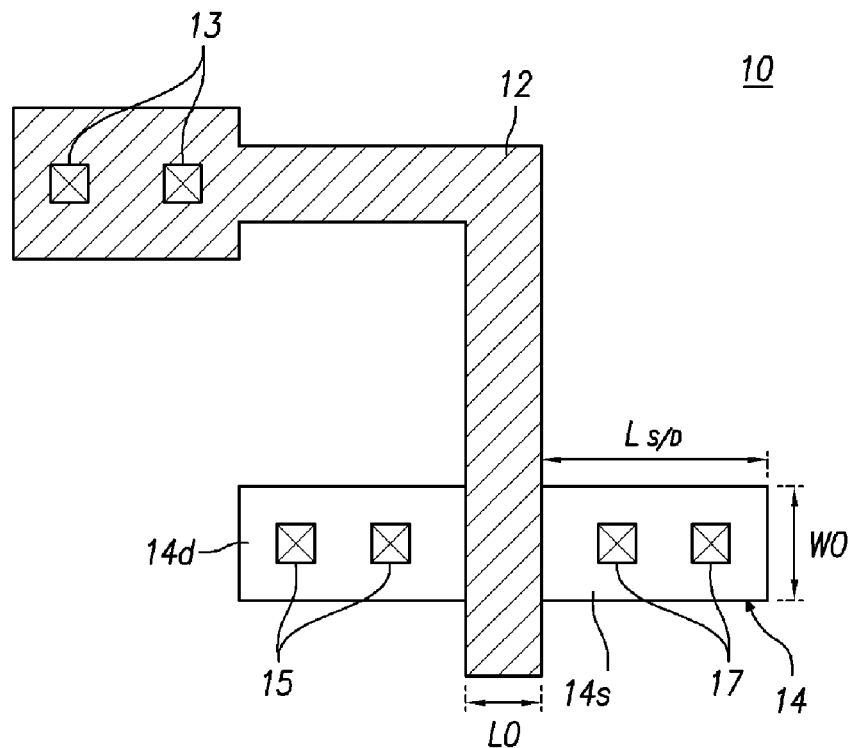
FIG. 1 is a plan layout view showing a reference transistor for illustrating a structural characteristic of a transistor according to the present invention.

FIG. 1 is a plan layout view showing a reference transistor for illustrating a structural characteristic of a transistor according to the present invention.

The transistor shown in FIG. 1 includes a gate conductor 12 and an active area 14. The gate conductor 12, for example, is made of poly-silicon and intersects the active area 14. The active area 14 is an area in which impurities (e.g., N-type impurities such as P, As and N, or P-type impurities such as B, Ga and In) are implanted or diffused onto a semiconductor (e.g., silicon) substrate. The active area 14 is divided into source and drain areas 14s and 14d with the gate conductor 12 overlapping with the active area 14 as reference.

Since a gate insulating layer (not shown) is formed beneath a surface of the gate conductor 12 overlapping with the active area 14, the gate conductor 12 is electrically isolated from the active area 14. The gate conductor 12 is connected electrically to the outside (e.g., a gate electrode) through gate contact holes 13. Further, the source and drain areas 14s and 14d are connected electrically to the outside through source and drain contact holes 17 and 15, respectively.

If a bias voltage (a positive (+) voltage in an NMOS transistor or a negative (−) voltage in a PMOS transistor) of a threshold voltage or more is applied to the gate conductor 12, an electric field is formed with the gate conductor as a center, and a channel (not shown) is formed below the gate insulating layer due to the influence of the electric field. If the channel is formed by a gate voltage, a current flows between the source and drain areas 14s and 14d. Since the current does not flow through the channel if the bias voltage is removed, the operation of a transistor can be implemented. Since the transistor includes a semiconductor substrate, a gate insulating layer and a gate conductor, the transistor is referred to as a MOS transistor.

The MOS transistor 10 of FIG. 1 is a narrow width transistor having a small width W0 of 0.3 μm and a channel length L0 of 0.13 μm. When the MOS transistor 10 having such dimension and structure is implemented as NMOS and PMOS transistors, assuming that each driving current of the NMOS and PMOS transistors is 100, the inventor of the present invention has studied a structure of a transistor capable of optimizing the driving current while varying the structure and dimension of the transistor. As a result, it can be seen that a driving current is the most optimally enhanced in the structure and dimension of a transistor shown in FIG. 2, and both performance enhancements for PMOS and NMOS transistors can be achieved.

Figure 2:
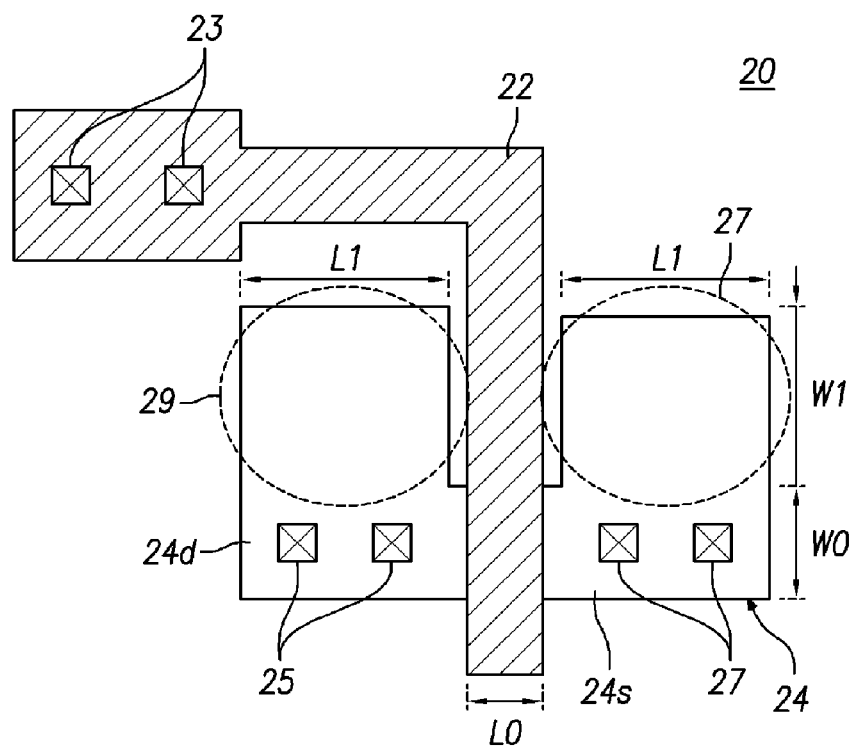
FIG. 2 is a plan layout view illustrating a structure of the transistor according to the present invention.

That is, the transistor 20 according to the present invention includes source and drain additional active areas 27 and 29 respectively having the source and drain areas extended in a channel width direction as shown in FIG. 2. The length L1 of each of the additional active areas 27 and 29 is set to be smaller than that $L_{s/d}$ of each of the source and drain areas 14s and 14d of the reference transistor 10 (FIG. 1) such that the channel width itself of the transistor 20 does not increase due to the additional active areas 27 and 29. Here, a difference between L1 and $L_{s/d}$ is set to be maximal as long as the design rule accepts it.

Since the respective additional active areas 27 and 29 are the same areas in which impurities are diffused as the source and drain areas 24s and 24d, only the pattern of a mask is modified to include a pattern corresponding to the additional active areas 27 and 29 without utilizing an additional photo mask to form the additional active areas 27 and 29. That is, in order to form the additional active areas 27 and 29 of the present invention, it is not required to modify a semiconductor manufacturing method or to introduce a new process.

According to an embodiment of the present invention, the width W1 of each of the additional active areas 27 and 29 is 0.35 μm, and the length L1 thereof is 0.3 μm. That is, the width of each of the additional active areas 27 and 29 according to the present invention is larger than the channel width of the transistor 20. The channel width W0 and length L0 of the transistor 20 are the same as those of the reference transistor 10. When the structure of a transistor is modified to include the additional active areas 27 and 29 having such dimensions and the structure is applied to an NMOS transistor, the driving current of the transistor 20 is represented as 107.27% as compared with that of the reference transistor 10. When the structure is applied to a PMOS transistor, the driving current is represented as 103.31%. That is, it can be seen that the current driving performance of the transistor 20 of the present invention is represented as 103% or more in both PMOS and NMOS transistors as compared with that of the reference transistor 10 so that both performance of the PMOS and NMOS transistors can be simultaneously enhanced.

As shown in FIG. 2, the transistor 20 according to the present invention is a MOS transistor in which an active area 24 having the source and drain areas 24s and 24d intersects a gate conductor 22, the gate conductor 22 is connected electrically to the outside through gate contact holes 23, and the source and drain areas 24s and 24d are connected electrically to the outside through source and drain contact holes 27 and 25, respectively.

Figure 3:
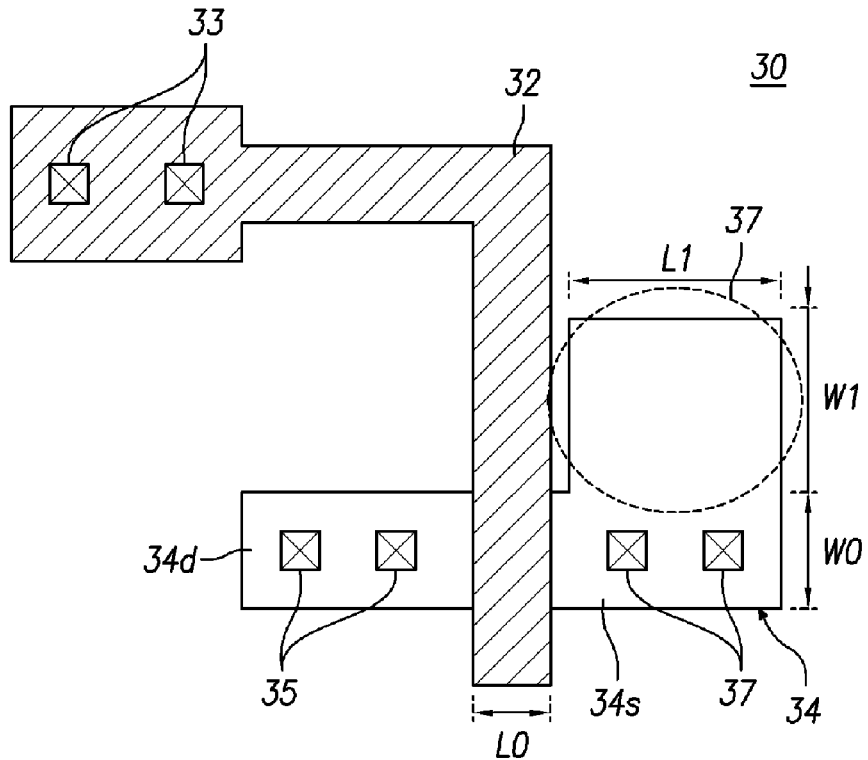
FIG. 3 is a plan layout view showing a first comparison transistor compared with the structure of the transistor according to the present invention.

FIG. 3 is a plan layout view showing a first comparison transistor compared with the structure of the transistor according to the present invention.

As shown in FIG. 3, the first comparison transistor 30 is a MOS transistor in which an active area 34 having source and drain areas 34s and 34d intersects a gate conductor 32, the gate conductor 32 is connected electrically to the outside through gate contact holes 33, and the source and drain areas 34s and 34d are connected electrically to the outside through source and drain contact holes 37 and 35, respectively.

In the first comparison transistor 30, an additional active area is formed at any one of source and drain areas. As an example, an additional active area 37 is added to the source area 34s in this figure. The width W1 and length L1 of the additional active area 37 is identical to the additional active areas 27 and 29 of the transistor 20 according to the present invention. As such, the width W1 of the additional active area 37 is set to be 0.35 μm, and the channel width and length of the first comparison transistor 30 is set to be identical to the reference transistor 10. When the structure having such dimensions is applied to an NMOS transistor, the driving current of the first comparison transistor 30 is represented as 101.14% as compared with the reference transistor 10. When the structure is applied to a PMOS transistor, the driving current is represented as 100.00%, representing no difference between the first comparison transistor 30 and the reference transistor 10.

Figure 4:
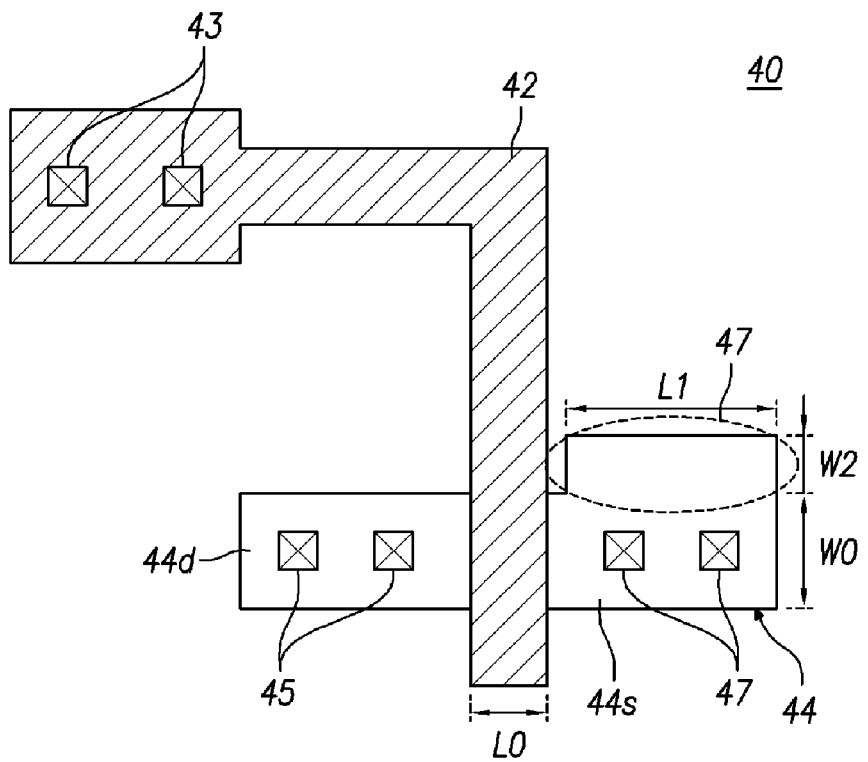
FIG. 4 is a plan layout view showing a second comparison transistor compared with the structure of the transistor according to the present invention.

FIG. 4 is a plan layout view showing a second comparison transistor compared with the structure of the transistor according to the present invention.

As shown in FIG. 4, the second comparison transistor 40 is a MOS transistor in which an active area 44 having source and drain areas 44s and 44d intersects a gate conductor 42, the gate conductor 42 is connected electrically to the outside through gate contact holes 43, and the source and drain areas 44s and 44d are connected electrically to the outside through source and drain contact holes 47 and 45, respectively.

In the second comparison transistor 40, an additional active area is formed at any one of source and drain areas like the first comparison transistor 30. As an example, an additional active area 47 is added to the source area 44s in this figure. The width W2 of the additional active area 47 is smaller than those of the additional active areas 27 and 29 of the transistor 20 according to the present invention. The length L1 of the additional active area 47 is identical to the transistor 20 of the present invention. As such, the width W2 of the additional active area 47 is set to be 0.3 μm, which is smaller than W1, and the channel width and length of the second comparison transistor 40 is set to be identical to the reference transistor 10. When the structure having such dimensions is applied to an NMOS transistor, the driving current of the second comparison transistor 40 is represented as 101.82% as compared with the reference transistor 10. When the structure is applied to a PMOS transistor, the driving current is represented as 98.90%, which is smaller than that of the reference transistor 10.

Figure 5:
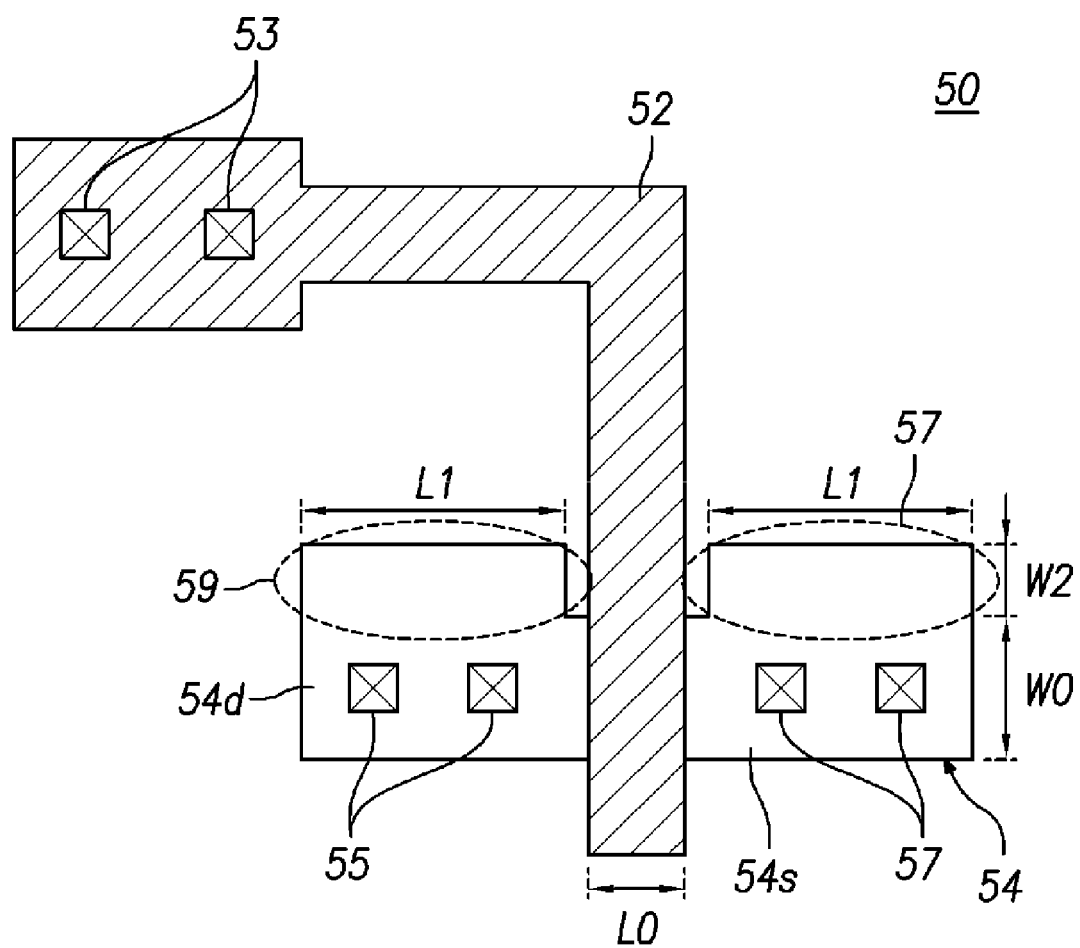
FIG. 5 is a plan layout view showing a third comparison transistor compared with the structure of the transistor according to the present invention.

FIG. 5 is a plan layout view showing a third comparison transistor compared with the structure of the transistor according to the present invention.

As shown in FIG. 5, the third comparison transistor 50 is a MOS transistor, like the reference transistor 10, in which an active area 54 having source and drain areas 54s and 54d intersects a gate conductor 52, the gate conductor 52 is connected electrically to the outside through gate contact holes 53, and the source and drain areas 54s and 54d are connected electrically to the outside through source and drain contact holes 57 and 55, respectively.

In the third comparison transistor 50, additional active areas 57 and 59 are respectively formed at both source and drain areas 54s and 54d like the transistor 20 of the present invention. At this time, the width W2 of each of the additional active areas 57 and 59 is smaller than that W1 of each of the additional active areas 27 and 29 of the transistor 20 according to the present invention. The length L1 of each of the additional active areas 57 and 59 is identical to the transistor 20 of the present invention. As such, the width W2 of each of the additional active areas 57 and 59 is set to be 0.3 μm, which is smaller than W1, and the channel width and length of the third comparison transistor 50 are set to be identical to the reference transistor 10. When the structure having such dimensions is applied to an NMOS transistor, the driving current of the third comparison transistor 50 is represented as 100.68% as compared with the reference transistor 10. When the structure is applied to a PMOS transistor, the driving current is represented as 100.55%, representing little difference between the third comparison transistor 50 and the reference transistor 10.

Comparing the channel widths and lengths of the reference transistor 10, transistor 20 of the present invention, and first to third comparison transistors 30, 40 and 50, the widths and lengths of the additional active areas 27, 29, 37, 47, 57 and 59, and the driving currents when the respective transistors are implemented as an NMOS or PMOS transistor, with the dimensions of the aforementioned embodiments as reference, they are shown in the following Table:

TABLE 1

| Classification | Channel Width | Channel length | Additional Active Area | Width of Additional Active Area | Length of Additional Active Area | NMOS Driving Current | PMOS Driving Current |
|---|---|---|---|---|---|---|---|
| Ref Trans. | 0.3 μm | 0.13 μm | None | — | — | 100 | 100 |
| Trans. of present invention | 0.3 μm | 0.13 μm | 2 | 0.35 μm | 0.3 μm | 107.27% | 103.31% |
| $1^{st}$ Comparison Trans. | 0.3 μm | 0.13 μm | 1 | 0.35 μm | 0.3 μm | 101.14% | 100.0% |
| $2^{nd}$ comparison Trans. | 0.3 μm | 0.13 μm | 1 | 0.3 μm | 0.3 μm | 101.82% | 98.90% |
| $3^{rd}$ comparison trans. | 0.3 μm | 0.13 μm | 2 | 0.3 μm | 0.3 μm | 100.68% | 100.55% |

As shown in Table 1, the structure of the transistor 20 according to the present invention is not modified by setting the channel width and length of the transistor 20 to be identical to the reference transistor 10, and the additional active areas 27 and 29 is added to the transistor 20, so that the driving currents of both NMOS and PMOS transistors can be enhanced by 103% or more.

According to the present invention, problems with both PMOS and NMOS transistors can be solved because a driving control drops due to a narrow width effect while the channel width of a transistor is reduced.

Further, in order to improve the driving current performance of the transistor according to the present invention, it is not necessary to add an additional process or to modify a process itself, so that the performance of a MOS transistor can be enhanced without additional costs.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method of making a MOS transistor, comprising:
   forming a gate insulating layer on a semiconductor substrate;
   forming a gate conductor on the gate insulating layer over a channel in the substrate, the channel having a width W0 and a length L0, and the gate conductor having a contact region not intersecting an active area of the MOS transistor; and
   implanting dopant ions using a photo mask in an active area of the substrate to form (i) a source and a drain on opposite sides of the channel, each of the source and the drain having a width equal to W0, a length $L_{s/d}$, and a contact region, and (ii) at least one of an additional source area and an additional drain area, the additional source area and/or additional drain area extending between the contact region of the source and/or the drain to the contact region of the gate conductor, and having a width W1 larger than W0 and a length L1 less than $L_{s/d}$.

2. The method of claim 1, comprising forming both the additional source area and the additional drain area.

3. The method of claim 2, wherein the source, the drain, the additional source area and the additional drain area are formed simultaneously.

4. The method of claim 1, wherein forming the gate conductor further comprises forming the contact region on the gate conductor, the contact region having a length and a width that are both greater than a length of the gate conductor.

5. The method of claim 4, wherein the gate conductor has a first portion intersecting the channel and a second portion connected to the contact region.

6. The method of claim 5, wherein the additional source area and/or the additional drain area are adjacent to a third portion of the gate conductor.

7. The method of claim 6, wherein the gate conductor comprises a fourth portion connected at one end to the second portion of the gate conductor and at another end to the third portion of the gate conductor.

8. The method of claim 7, wherein the fourth portion of the gate conductor is perpendicular to the first and the third portions, and is not in the active area.

9. The method of claim 6, wherein the third portion of the gate conductor does not intersect the additional source area and/or the additional drain area.

10. The method of claim 1, wherein implanting dopant ions in the active area comprises implanting N-type impurities.

11. The method of claim 1, wherein implanting dopant ions in the active area comprises implanting P-type impurities.

12. The method of claim 1, wherein the additional source area is continuous with the source.

13. The method of claim 1, wherein the additional drain area is continuous with the drain.

14. The method of claim 4, further comprising forming one or more contacts on the contact region.

15. The method of claim 1, further comprising forming the contact regions in the source and the drain.

16. The method of claim 15, further comprising forming one or more contacts on each of the source and the drain.

17. The method of claim 12, wherein the length L1 of the additional source area is sufficiently smaller than the length $L_{s/d}$ of the source so that the width W0 of the channel does not increase due to the additional source area.

18. The method of claim 13, wherein the length of the additional drain area is sufficiently smaller than the length $L_{s/d}$ of the drain so that the width W0 of the channel does not increase due to the additional drain source area.

* * * * *